United States Patent
Chen

(10) Patent No.: US 10,910,320 B2
(45) Date of Patent: Feb. 2, 2021

(54) SHIELDED MOM CAPACITOR

(71) Applicant: MEDIATEK INC., Hsin-Chu (TW)

(72) Inventor: Shi-Bai Chen, Hsinchu County (TW)

(73) Assignee: MEDIATEK INC., Hsin-Chu (TW)

(*) Notice: Subject to any disclaimer, the term of this patent is extended or adjusted under 35 U.S.C. 154(b) by 25 days.

(21) Appl. No.: 16/129,751

(22) Filed: Sep. 12, 2018

(65) Prior Publication Data

US 2019/0164903 A1 May 30, 2019

Related U.S. Application Data

(60) Provisional application No. 62/592,540, filed on Nov. 30, 2017.

(51) Int. Cl.
*H01L 23/552* (2006.01)
*H01L 49/02* (2006.01)
*H01L 23/522* (2006.01)

(52) U.S. Cl.
CPC ........ *H01L 23/552* (2013.01); *H01L 23/5223* (2013.01); *H01L 23/5225* (2013.01); *H01L 28/40* (2013.01); *H01L 28/90* (2013.01)

(58) Field of Classification Search
None
See application file for complete search history.

(56) References Cited

U.S. PATENT DOCUMENTS

| | | | |
|---|---|---|---|
| 2006/0061935 A1* | 3/2006 | Schultz | H01G 2/22 361/306.1 |
| 2007/0278551 A1 | 12/2007 | Anthony | |
| 2009/0160020 A1* | 6/2009 | Barth | H01L 23/5223 257/532 |
| 2010/0061035 A1* | 3/2010 | Kitamura | H01L 23/5223 361/301.4 |
| 2011/0254132 A1* | 10/2011 | Cho | H01G 4/232 257/534 |
| 2017/0154951 A1* | 6/2017 | Cui | H01L 28/88 |

FOREIGN PATENT DOCUMENTS

| | | |
|---|---|---|
| TW | 201435998 A | 9/2014 |
| TW | 201611305 A | 3/2016 |
| TW | 201618313 A | 5/2016 |

* cited by examiner

*Primary Examiner* — Davienne N Monbleau
*Assistant Examiner* — Scott R Wilson
(74) *Attorney, Agent, or Firm* — Winston Hsu

(57) ABSTRACT

A shielded metal-oxide-metal (MOM) capacitor includes a substrate, a lower shielding plate disposed on the substrate and in parallel with a major surface of the substrate, an upper shielding plate situated above the lower shielding plate and in parallel with the lower shielding plate, and a middle plate sandwiched between the lower shielding plate and the upper shielding plate. The middle plate includes two parallel first connecting bars extending along a first direction, a plurality of first fingers extending between the two parallel first connecting bars along a second direction, and an electrode strip spaced apart from and surrounded by the two parallel first connecting bars and the first fingers.

18 Claims, 9 Drawing Sheets

SHIELDED MOM CAPACITOR

CROSS REFERENCE TO RELATED APPLICATIONS

This application claims priority from U.S. provisional application No. 62/592,540 filed Nov. 30, 2017, the subject matter of which is hereby incorporated by reference.

BACKGROUND

Passive components such as capacitors are extensively used in integrated circuit (IC) design for radio-frequency (RF) and mixed-signal applications, such as successive approximation register analog-to-digital converters (SAR ADCs).

SAR ADC has small area and low power consumption, which is especially suitable for wearable, handheld, and sensor applications. There is a need in this industry to provide an integrated metal-oxide-metal (mom) capacitor structure for the SAR ADC, which meets the requirements of low RC parasitic (insensitive parasitic) and a unit capacitance of at least 1 fF for 10-bits ADC.

SUMMARY

It is one object of the present disclosure to provide an improved shielded metal-oxide-metal (MOM) capacitor that is able to meet the requirements of low RC parasitic capacitance and a unit capacitance of 1 fF for 10-bits ADC.

According to one embodiment of the invention, a shielded metal-oxide-metal (MOM) capacitor includes a substrate, a lower shielding plate disposed on the substrate and in parallel with a major surface of the substrate, an upper shielding plate situated above the lower shielding plate and in parallel with the lower shielding plate, and a middle plate sandwiched between the lower shielding plate and the upper shielding plate. The middle plate comprises two parallel first connecting bars extending along a first direction, a plurality of first fingers extending between the two parallel first connecting bars along a second direction, and an electrode strip spaced apart from and surrounded by the two parallel first connecting bars and the first fingers.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms "die", "chip", "semiconductor chip", and "semiconductor die" are used interchangeable throughout the specification to mean integrated circuit chip or die. The term "horizontal" as used herein may be defined as a direction parallel to a plane or surface (e.g., surface of a substrate or a stage), regardless of its orientation. The term "vertical," as used herein, may refer to a direction orthogonal to the horizontal direction as just described. Terms, such as "on," "above," "below," "bottom," "top," "side" (as in "sidewall"), "higher," "lower," "upper," "over," and "under," may be referenced with respect to the horizontal plane.

The term "capacitor" or "capacitor element" is herein referred to as an on-chip capacitive element composed of a layer of dielectric material and two electrodes sandwiching the dielectric material layer fabricated in the BEOL (back-end of line) process, unless otherwise specified. When a voltage is applied across the electrodes, the charges accumulate on the electrodes, thereby storing the electrical energy.

In the CMOS process, the most common on-chip capacitive elements are metal-insulator-metal (MIM) capacitors and metal-oxide-metal (MOM) capacitors. MIM capacitors, also commonly known as sandwich capacitors, need several extra procedures in the BEOL process to make the capacitor structure. MOM capacitors, or vertical capacitors, are fabricated in the CMOS process using the existing metal layers and inter-layer dielectric layers in the back-end interconnection process.

The present disclosure pertains to a shielded MOM capacitor that provides a low RC parasitic (insensitive parasitic) configuration and a unit capacitance of at least 1 fF, which is particularly suitable for application to a successive approximation register analog-to-digital converters (SAR ADCs).

Figure 1:
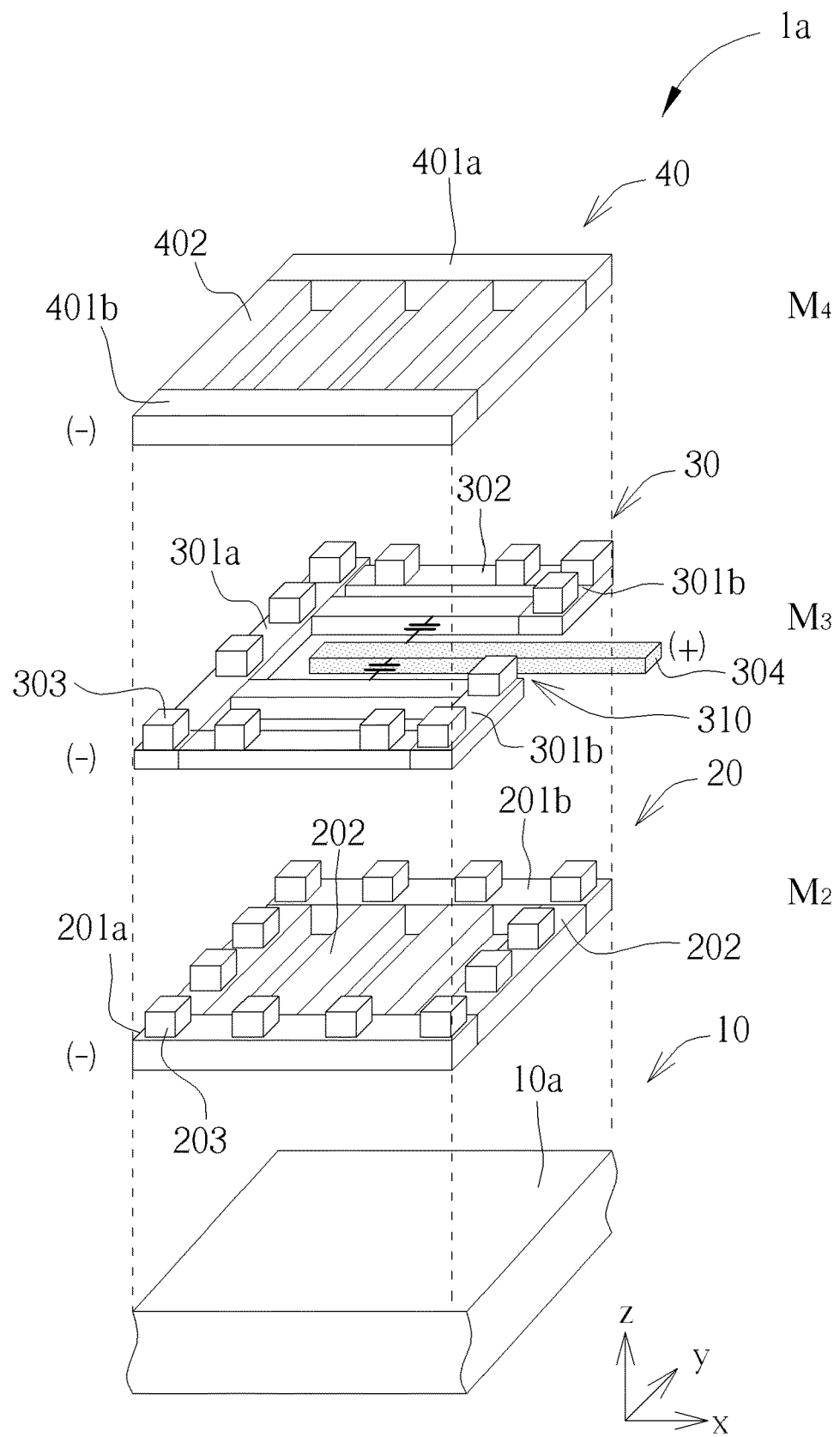
FIG. 1 is a perspective exploded diagram showing a shielded MOM capacitor according to one embodiment of the invention.

Please refer to FIG. 1. FIG. 1 is a perspective exploded diagram showing a shielded MOM capacitor according to one embodiment of the invention. As shown in FIG. 1, the shielded MOM capacitor 1a may be fabricated on a substrate 10 such as a semiconductor substrate and may be formed as part of an integrated circuit. It is understood that a plurality of material layers such as dielectric layer(s), polysilicon layer(s) or lower metal layer(s) may be formed on the substrate 10. For the sake of simplicity, these material layers are not shown in the figures.

For the sake of simplicity, the inter-metal dielectric layers are omitted in the figures. It is to be understood that an insulation material fills the vacancy between two neighboring fingers as well as between electrode strips and fingers. The insulation material may be an extreme low k (ELK) material. The ELK material may comprise fluorine-doped oxide, carbon-doped silicon oxide or the like. The insulation material may comprise silicon oxide, silicon oxy-nitride, or silicon nitride, but is not limited thereto.

According to one embodiment, the shielded MOM capacitor 1a is a three-layer (i.e. three metal layer) stack structure, which comprises a lower shielding plate 20 that is in parallel with a major surface 10a of the substrate 10. The lower shielding plate 20 may comprise two parallel connecting bars 201a and 201b extending along a first direction (e.g., the reference x-axis) and a plurality of fingers 202 extending between the two parallel connecting bars 201a and 201b along a second direction (e.g., the reference y-axis). For example, the first direction is perpendicular to the second direction. The two distal ends of each of the fingers 202 are in direct contact with the connecting bars 201a and 201b, respectively. A plurality of vias 203 is disposed on the parallel connecting bars 201a and 201b and on the fingers 202 for connection purposes. For example, the lower shielding plate 20 may be electrically connected to a first signal, such as ground (labeled by "(−)" in the figures). That is, the connecting bars 201a and 201b and the fingers 202 have the same polarity.

According to one embodiment, the lower shielding plate 20 may be fabricated in the same metal layer, such as the first metal layer (M1), the second metal layer (M2), or the third metal layer (M3), but is not limited thereto. For example, the lower shielding plate 20 may be fabricated in the second metal layer (M2). The metal layers may comprise copper, aluminum, or tungsten, but is not limited thereto.

The shielded MOM capacitor 1a further comprises an upper shielding plate 40 situated above the lower shielding plate 20. Likewise, the upper shielding plate 40 is in parallel with a major surface 10a of the substrate 10. The upper shielding plate 40 may comprise two parallel connecting bars 401a and 401b extending along the reference x-axis and a plurality of fingers 402 extending between the two parallel connecting bars 401a and 401b along the reference y-axis. The two distal ends of each of the fingers 402 are in direct contact with the connecting bars 401a and 401b, respectively. The two parallel connecting bars 401a and 401b and the fingers 402 of the upper shielding plate 40 may be electrically connected to the same polarity as that of the lower shielding plate 20, for example, ground.

According to one embodiment, the upper shielding plate 40 may be fabricated in the same metal layer, such as the third metal layer (M3), the fourth metal layer (M4), or the fifth metal layer (M5), but is not limited thereto. For example, the upper shielding plate 40 may be fabricated in the fourth metal layer (M4).

According to one embodiment, the pitch of plurality of fingers 402 of the upper shielding plate 40 may be equal to the minimum pitch rule. It is known that in some advanced processes, there are minimum pitch (MINP) along a first direction and non-minimum pitch (NMINP) along a second direction. Typically, the first direction is perpendicular to the second direction. For example, in 20 nm or 16 nm technology node, the MINP is above half of the NMINP.

It is known that a pitch is the distance between the same type of adjacent features or elements. The concept of pitch is used to describe the sizes of these features. The term "pitch" is defined as the distance between identical points in two neighboring features such as polysilicon gate lines having a repeating pattern.

The shielded MOM capacitor 1a further comprises a middle plate 30 interposed between the horizontal lower shielding plate 20 and the upper shielding plate 40. For example, the middle plate 30 may be fabricated in the third metal layer (M3). The middle plate 30 comprises two parallel connecting bars 301a and 301b extending along the reference y-axis and a plurality of fingers 302 extending between the two parallel connecting bars 301a and 301b along the reference x-axis. The connecting bar 301b is discontinuous and has a gap 310.

A plurality of vias 303 is disposed on the parallel connecting bars 301a and 301b and on the fingers 302 for connection purposes. The parallel connecting bars 301a and 301b and the fingers 302 of the middle plate 30 are electrically connected to the upper shielding plate 40 through the plurality of vias 303. The lower shielding plate 20 is electrically connected to the parallel connecting bars 301a and 301b and the fingers 302 of the middle plate 30 through the plurality of vias 203.

The middle plate 30 comprises an electrode strip 304 surrounded by the connecting bar 301a and the fingers 302. The electrode strip 304 is coplanar with the connecting bar 301a and the fingers 302. The electrode strip 304 extends along the reference x-axis and passes through the gap 310. According to one embodiment, the electrode strip 304 is electrically connected to a second signal, such as an output signal (labeled by "(+)" in the figures), thereby constituting a capacitor between the electrode strip 304 and the adjacent fingers 302. The capacitor formed between the electrode strip 304 and the adjacent fingers 302 is shielded by the lower shielding plate 20 and the upper shielding plate 40, which is able to provide a low RC parasitic (insensitive parasitic) configuration and a unit capacitance of at least 1 fF for 10-bits ADC.

Figure 2:
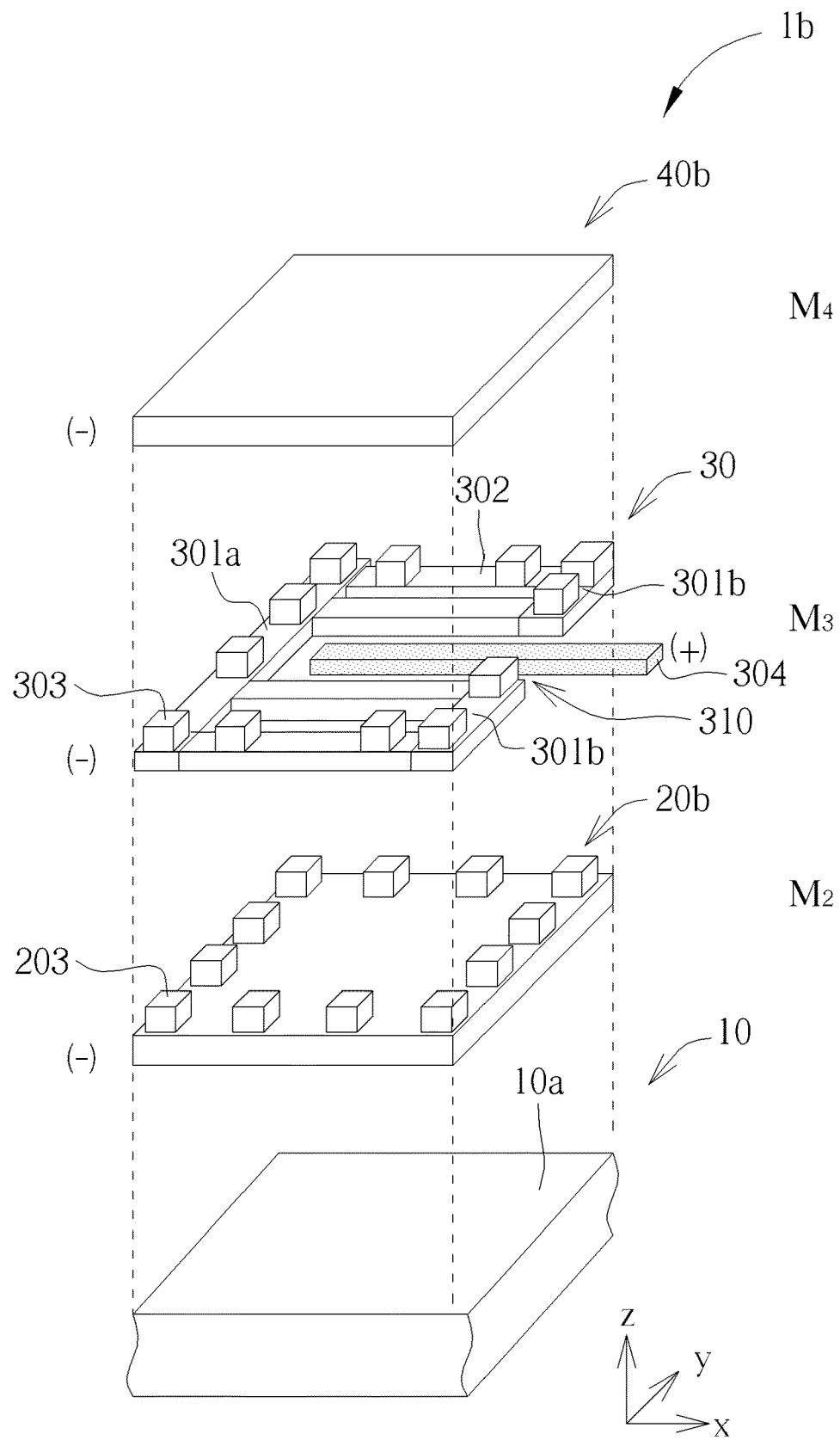
FIG. 2 and FIG. 3 show variants of the shielded MOM capacitor of FIG. 1.
Figure 3:
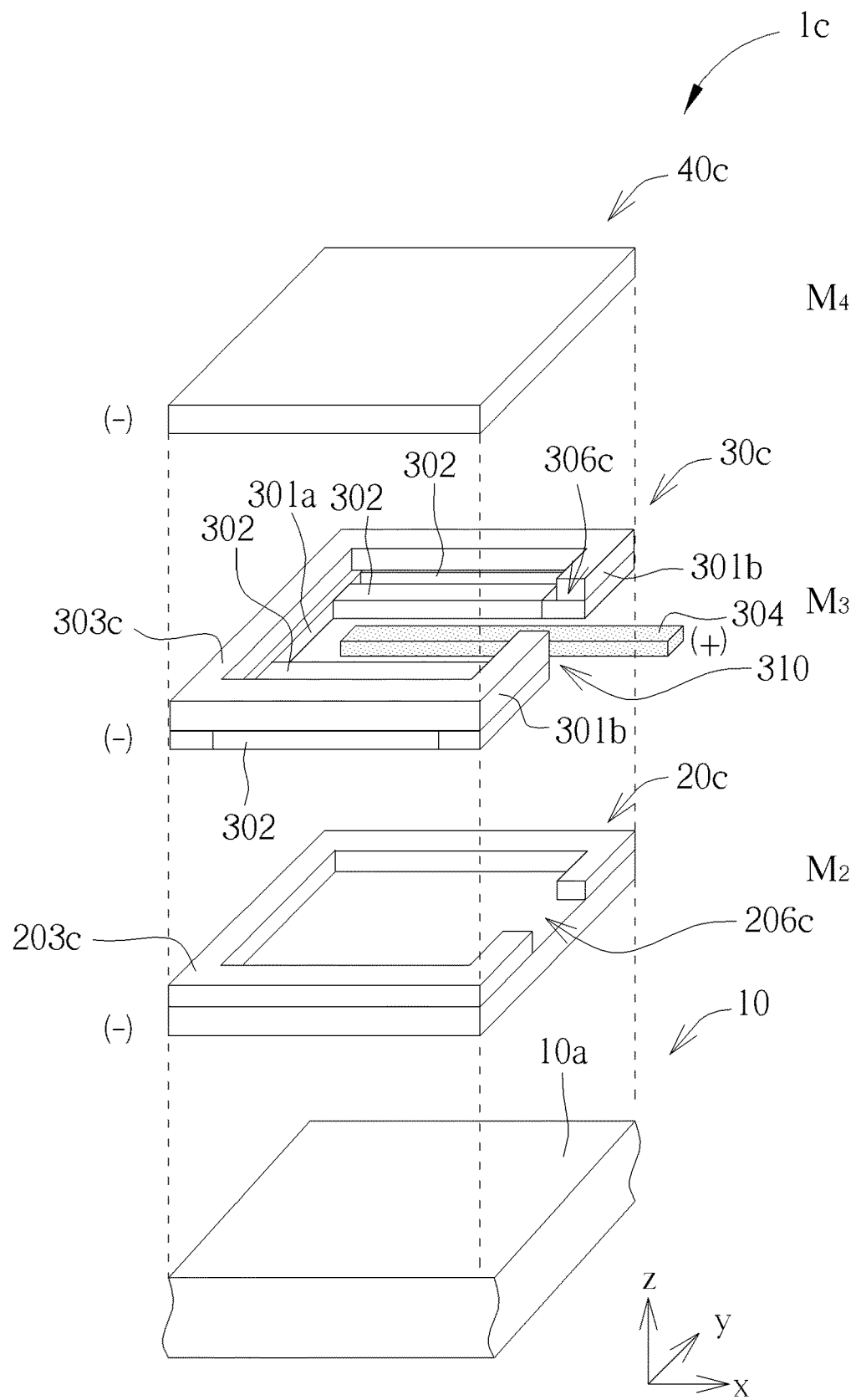

FIG. 2 and FIG. 3 show variants of the shielded MOM capacitor 1a of FIG. 1, wherein like numeral numbers designate like elements, regions, or layers. As shown in FIG. 2, the difference between the shielded MOM capacitor 1a of FIG. 1 and the shielded MOM capacitor 1b of FIG. 2 is that the shielded MOM capacitor 1b comprises a solid lower shielding plate 20b and a solid upper shielding plate 40b sandwiching about the middle plate 30 that is identical to the middle plate of shielded MOM capacitor 1a of FIG. 1. In FIG. 2, the solid lower shielding plate 20b and the upper shielding plate 40b are both a continuous, horizontal metal plate that does not have any slit or opening in it.

As shown in FIG. 3, the difference between the shielded MOM capacitor 1c of FIG. 3 and the shielded MOM capacitor 1b of FIG. 2 is that the shielded MOM capacitor 1c comprises a slot via 203c between the lower metal plate 20c and middle plate 30c. The slot via 203c is disposed along the perimeter of the lower metal plate 20c and has similar pattern with the connecting bars and fingers of the middle plate 30c. A gap 206c may be provided directly under the electrode strip 304 such that the electrode strip 304 is insulated from the lower metal plate 20c. Likewise, a slot via 303c may be disposed between the middle plate 30c and the upper shielding plate 40c. The slot via 303c is disposed along the perimeter of the middle plate 30c on the connecting bars and fingers of the middle plate 30c. The slot vias and the solid shielding plate provide more effective shielding effects. The solid shielding plate depicted in FIG. 2 and the slot via depicted in FIG. 3 may be employed in other embodiments.

Figure 4:
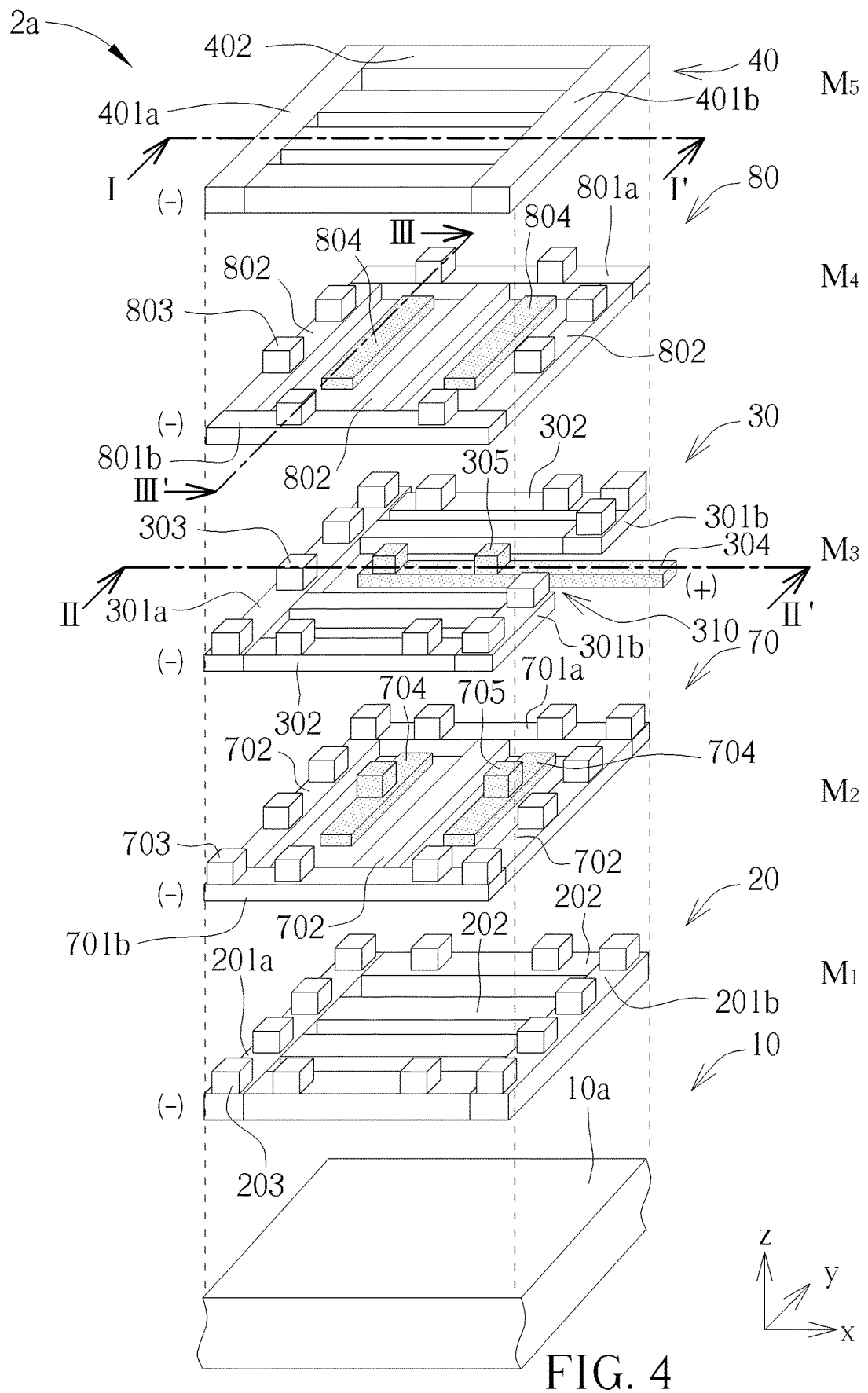
FIG. 4 is a perspective exploded diagram showing a shielded MOM capacitor according to another embodiment of the invention.
Figure 5:
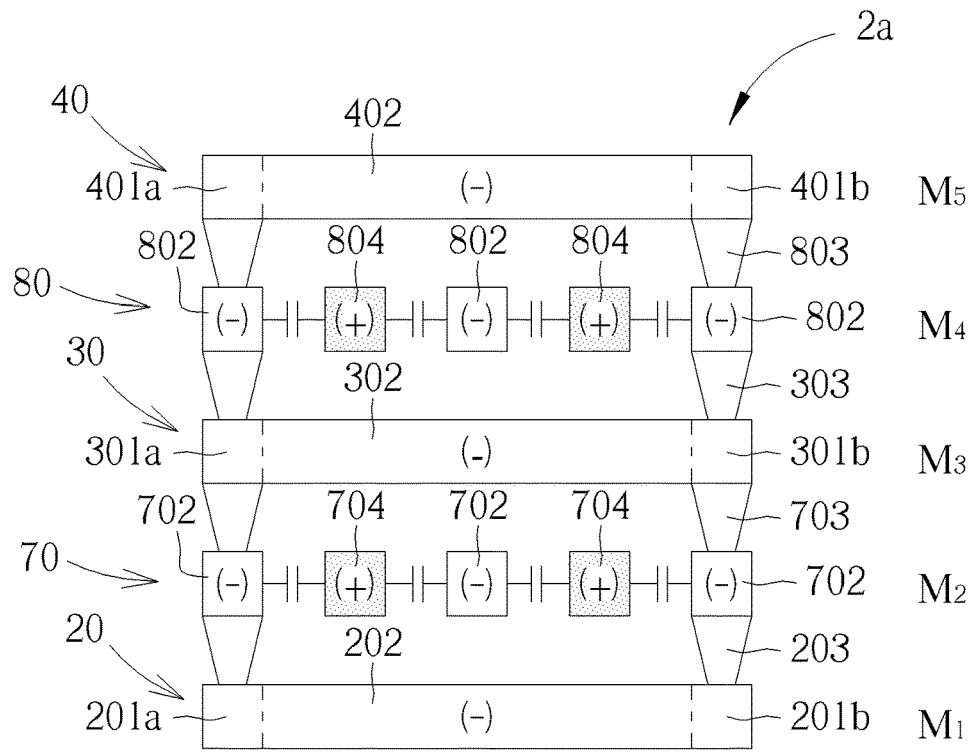
FIG. 5 is a schematic, cross-sectional view taken along line I-I' in FIG. 4.
Figure 6:
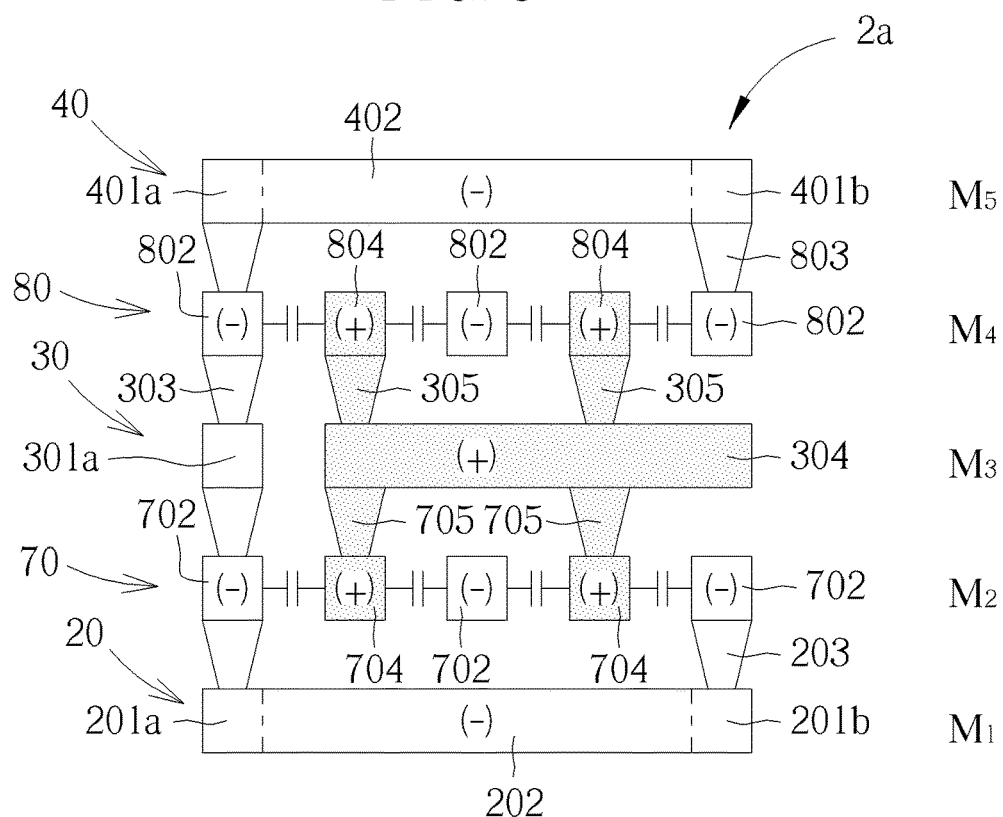
FIG. 6 is a schematic, cross-sectional view taken along line II-II' in FIG. 4.
Figure 7:
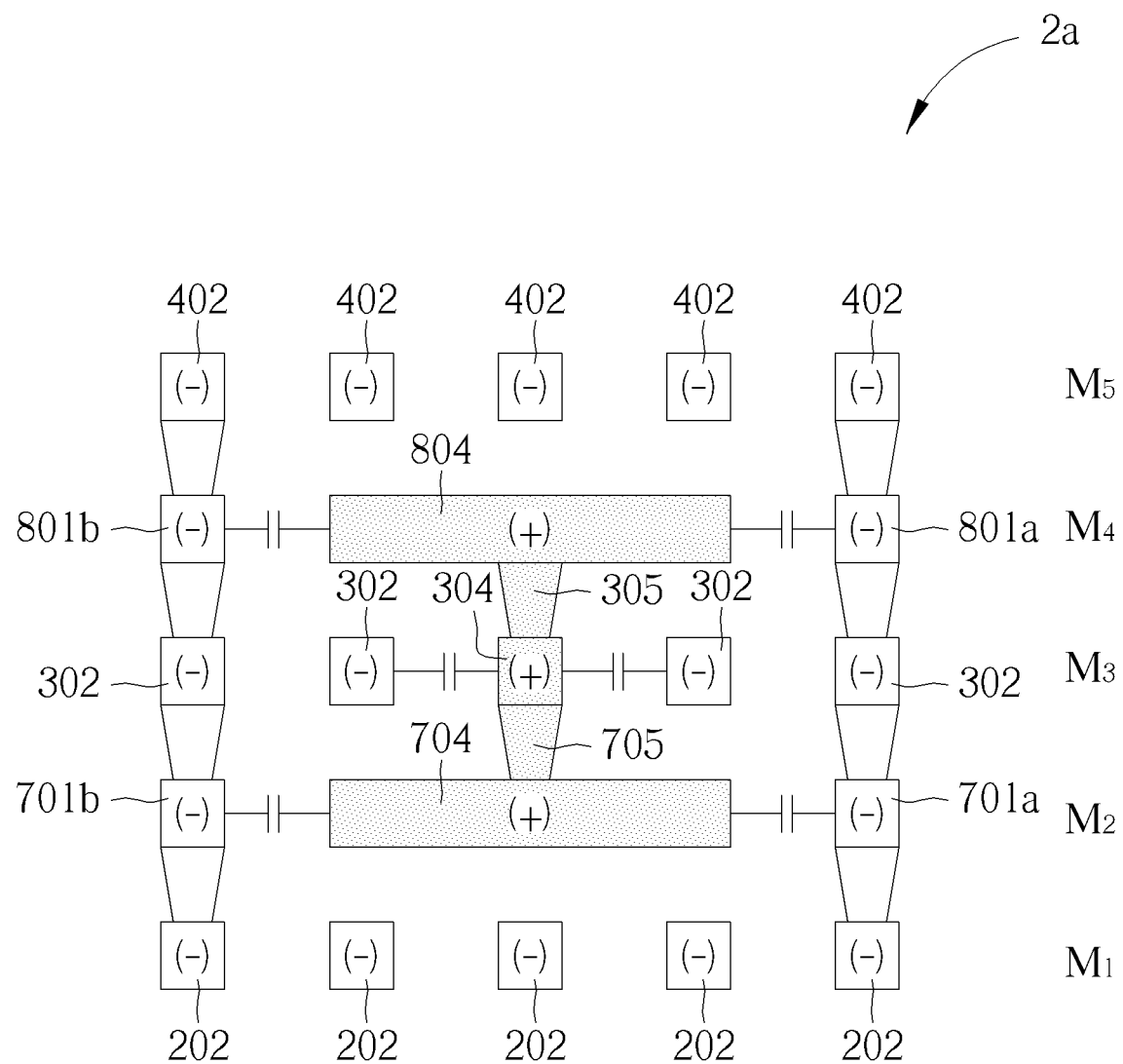
FIG. 7 is a schematic, cross-sectional view taken along line III-III' in FIG. 4.

Please refer to FIG. 4 to FIG. 7. FIG. 4 is a perspective exploded diagram showing a shielded MOM capacitor according to another embodiment of the invention, wherein like numeral numbers designate like elements, regions, or layers. FIG. 5 is a schematic, cross-sectional view taken along line I-I' in FIG. 4. FIG. 6 is a schematic, cross-sectional view taken along line II-II' in FIG. 4. FIG. 7 is a schematic, cross-sectional view taken along line III-III' in FIG. 4.

As shown in FIG. 4 to FIG. 7, the shielded MOM capacitor 2a may be fabricated on a substrate 10 such as a semiconductor substrate and may be formed as part of an integrated circuit. It is understood that a plurality of material layers such as dielectric layer(s), polysilicon layer(s) or lower metal layer(s) may be formed on the substrate 10. For the sake of simplicity, the inter-metal dielectric layers are omitted in the figures.

According to one embodiment, the shielded MOM capacitor 2a is a five-layer (i.e. five metal layer) stack structure, which comprises a lower shielding plate 20 that is in parallel with a major surface 10a of the substrate 10. The lower shielding plate 20 may comprise two parallel connecting bars 201a and 201b extending along the reference y-axis and a plurality of fingers 202 extending between the two parallel connecting bars 201a and 201b along the reference x-axis. The two distal ends of each of the fingers 202 are in direct contact with the connecting bars 201a and 201b, respectively. A plurality of vias 203 is disposed on the parallel connecting bars 201a and 201b and on the fingers 202 for connection purposes. For example, the lower shielding plate 20 may be electrically connected to a first signal, such as ground (labeled by "(−)" in the figures).

According to one embodiment, the lower shielding plate 20 may be fabricated in the same metal layer, such as the first metal layer (M1), the second metal layer (M2), or the third metal layer (M3), but is not limited thereto. For example, the lower shielding plate 20 may be fabricated in the first metal layer (M1). The metal layers may comprise copper, aluminum, or tungsten, but is not limited thereto.

The shielded MOM capacitor 2a further comprises an upper shielding plate 40 situated above the lower shielding plate 20. Likewise, the upper shielding plate 40 is in parallel with a major surface 10a of the substrate 10. The upper shielding plate 40 may comprise two parallel connecting bars 401a and 401b extending along the reference y-axis and a plurality of fingers 402 extending between the two parallel connecting bars 401a and 401b along the reference x-axis. The two distal ends of each of the fingers 402 are in direct contact with the connecting bars 401a and 401b, respectively. For example, the upper shielding plate 40 may be electrically connected to ground.

According to one embodiment, the upper shielding plate 40 may be fabricated in the same metal layer, such as the fifth metal layer (M5), the sixth metal layer (M6), or the seventh metal layer (M7), but is not limited thereto. For example, the upper shielding plate 40 may be fabricated in the fourth metal layer (M5).

According to one embodiment, the pitch of plurality of fingers 402 of the upper shielding plate 40 may be equal to the minimum pitch rule. It is known that in some advanced processes, there are minimum pitch (MINP) along a first direction and non-minimum pitch (NMINP) along a second direction. Typically, the first direction is perpendicular to the second direction. For example, in 20 nm or 16 nm technology node, the MINP is above half of the NMINP.

The shielded MOM capacitor 2a further comprises a middle plate 30 interposed between the horizontal lower shielding plate 20 and the upper shielding plate 40. For example, the middle plate 30 may be fabricated in the third metal layer (M3). The middle plate 30 comprises two parallel connecting bars 301a and 301b extending along the reference y-axis and a plurality of fingers 302 extending between the two parallel connecting bars 301a and 301b along the reference x-axis. The connecting bar 301b is discontinuous and has a gap 310. A plurality of vias 303 is disposed on the parallel connecting bars 301a and 301b and on the fingers 302 for connection purposes.

The middle plate 30 comprises an electrode strip 304 horizontally surrounded by the connecting bar 301a and the fingers 302. The electrode strip 304 is coplanar with the connecting bar 301a and the fingers 302. The electrode strip 304 extends along the reference x-axis and passes through the gap 310. According to one embodiment, the electrode strip 304 is electrically connected to a second signal, such as an output signal (labeled by "(+)" in the figures), thereby constituting a capacitor between the electrode strip 304 and the adjacent fingers 302. That is, the connecting bars 301a and 301b and the fingers 302 have the same polarity such as ground, and the electrode strip 304 has an opposite polarity.

The shielded MOM capacitor 2a further comprises intermediate shielding plates 70 and 80. The intermediate shielding plate 70 is interposed between the middle plate 30 and the lower shielding plate 20. The intermediate shielding plate 80 is interposed between the middle plate 30 and the upper shielding plate 40. For example, the intermediate shielding plate 70 may be fabricated in the second metal layer (M2) and the intermediate shielding plate 80 may be fabricated in the fourth metal layer (M4).

According to one embodiment, the intermediate shielding plates 70 and 80 may have the same layout. According to one embodiment, the intermediate shielding plate 70 may comprise two parallel connecting bars 701a and 701b extending along the reference x-axis and a plurality of fingers 702 extending between the two parallel connecting bars 701a and 701b along the reference y-axis. Two lower electrode strips 704 may be disposed between the fingers 702. Each of the two lower electrode strips 704 is spaced apart from the adjacent fingers 702 and connecting bars 701a and 701b and is enclosed by the fingers 702 and connecting bars 701a and 701b. The electrode strips 704 are electrically connected to the overlying electrode strip 304 through the vias 705. Therefore, the electrode strips 704 and the electrode strip 304 have the same polarity (+).

According to one embodiment, likewise, the intermediate shielding plate 80 may comprise two parallel connecting bars 801a and 801b extending along the reference x-axis and a plurality of fingers 802 extending between the two parallel connecting bars 801a and 801b along the reference y-axis. Two upper electrode strips 804 may be disposed between the fingers 802. Each of the two upper electrode strips 804 is spaced apart from the adjacent fingers 802 and connecting bars 801a and 801b and is enclosed by the fingers 802 and connecting bars 801a and 801b. The two upper electrode strips 804 are electrically connected to the underlying electrode strip 304 through the vias 305. Therefore, the electrode strips 704, 804 and the electrode strip 304 have the same polarity (+).

As shown in FIG. 5 to FIG. 7, sub-capacitors may be formed between the electrode strips 704 and the adjacent fingers 702 in the intermediate shielding plate 70, between the electrode strips 804 and the adjacent fingers 802 in the intermediate shielding plate 80, and between the electrode strip 304 and the adjacent fingers 302 in the middle plate 30. The capacitance may be the sum of these sub-capacitors. These sub-capacitors are shielded by the lower shielding plate 20 and the upper shielding plate 40, thereby providing a low RC parasitic (insensitive parasitic) configuration and a unit capacitance of at least 1 fF for 10-bits ADC.

Figure 8:
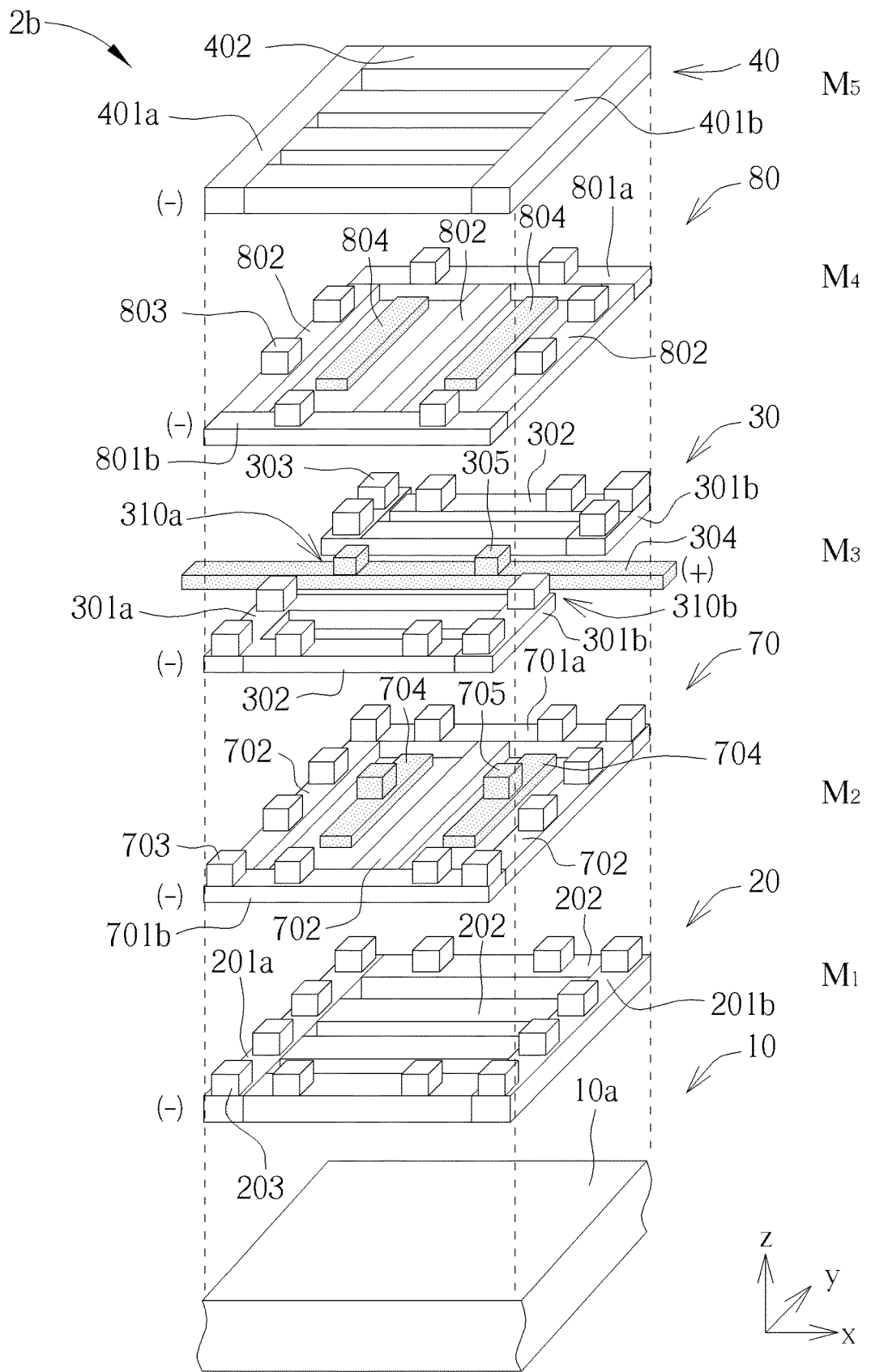
FIG. 8 is a perspective exploded diagram showing a shielded MOM capacitor according to another embodiment of the invention.

FIG. 8 is a perspective exploded diagram showing a shielded MOM capacitor according to another embodiment of the invention, wherein like numeral numbers designate like elements, regions, or layers. As shown in FIG. 8, the shielded MOM capacitor 2b is a five-layer (i.e. five metal layer) stack structure, which comprises a lower shielding plate 20, for example, in the M1 layer, an intermediate shielding plate 70, in the M2 layer, on the lower shielding plate 20, a middle plate 30, in the M3 layer, on the intermediate shielding plate 70, an intermediate shielding plate 80, in the M4 layer, on middle plate 30, and an upper shielding plate 40, in the M5 layer, on the intermediate shielding plate 80.

According to the embodiment, the middle plate 30 comprises two parallel connecting bars 301a and 301b extending along the reference y-axis and a plurality of fingers 302 extending between the two parallel connecting bars 301a and 301b along the reference x-axis. The connecting bars 301a and 301b are both discontinuous and have gaps 310a and 310b, respectively. The electrode strip 304, which is coplanar with the connecting bars 301a, 301b and the fingers 302, extends along the reference x-axis and passes through the gaps 310a and 310b.

Figure 9:
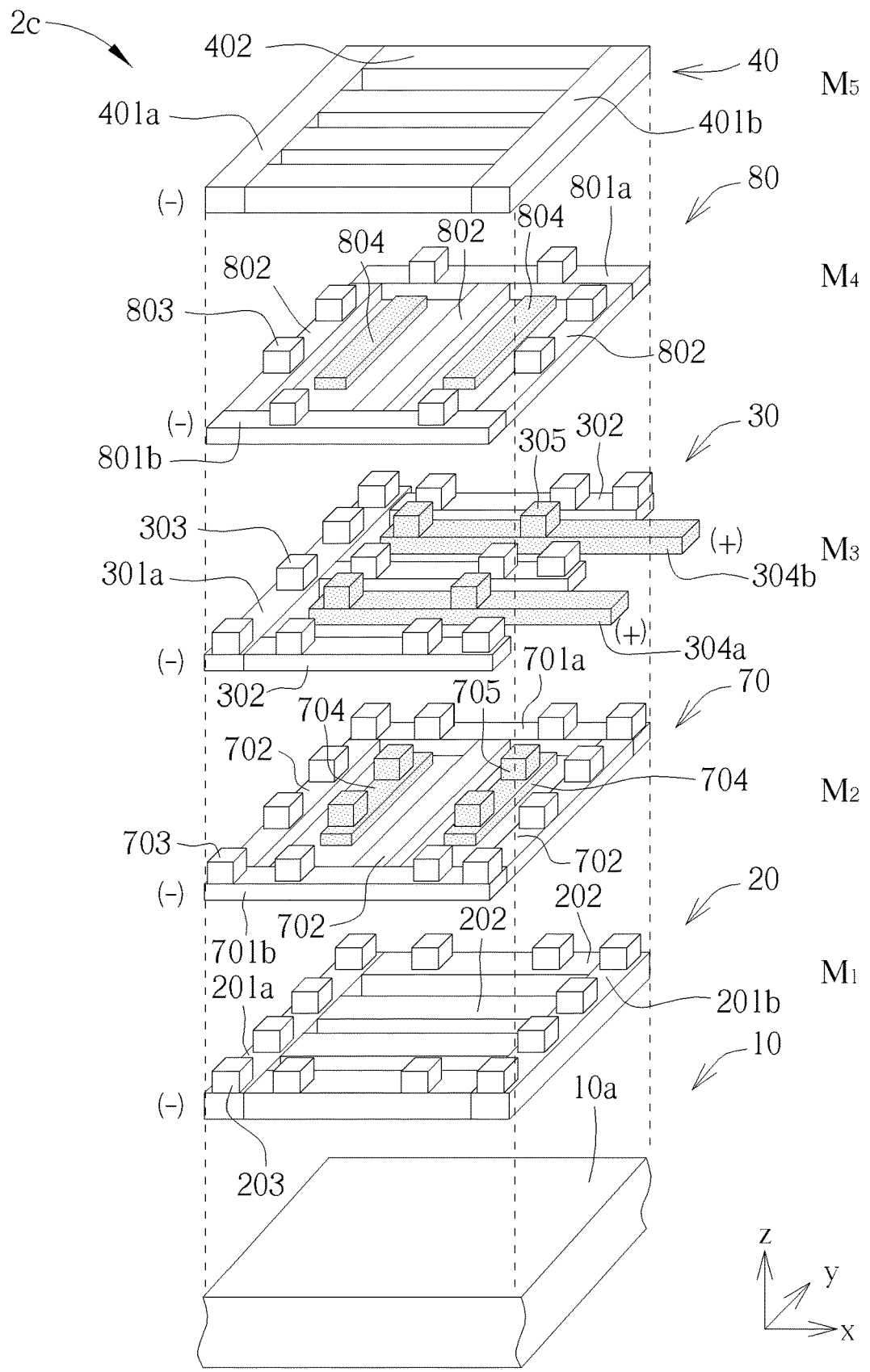
FIG. 9 is a perspective exploded diagram showing a shielded MOM capacitor according to still another embodiment of the invention.

FIG. 9 is a perspective exploded diagram showing a shielded MOM capacitor according to still another embodiment of the invention, wherein like numeral numbers designate like elements, regions, or layers. As shown in FIG. 9, the shielded MOM capacitor 2c is a five-layer (i.e. five metal layer) stack structure, which comprises a lower shielding plate 20, for example, in the M1 layer, an intermediate shielding plate 70, in the M2 layer, on the lower shielding plate 20, a middle plate 30, in the M3 layer, on the intermediate shielding plate 70, an intermediate shielding plate 80, in the M4 layer, on middle plate 30, and an upper shielding plate 40, in the M5 layer, on the intermediate shielding plate 80.

According to the embodiment, the middle plate 30 comprises one connecting bar 301a extending along the reference y-axis and a plurality of fingers 302 extending from one side of the connecting bar 301a along the reference x-axis. In FIG. 9, the connecting bar 301a and the fingers 302 are arranged as an E-shaped layout. The middle plate 30 further comprises electrode strips 304a and 304b, which are coplanar with the connecting bar 301a and the fingers 302. The electrode strips 304a and 304b are disposed between the fingers 302. The electrode strips 304a and 304b extend along the reference x-axis and protrude beyond the end surfaces of the fingers 302.

Figure 10:
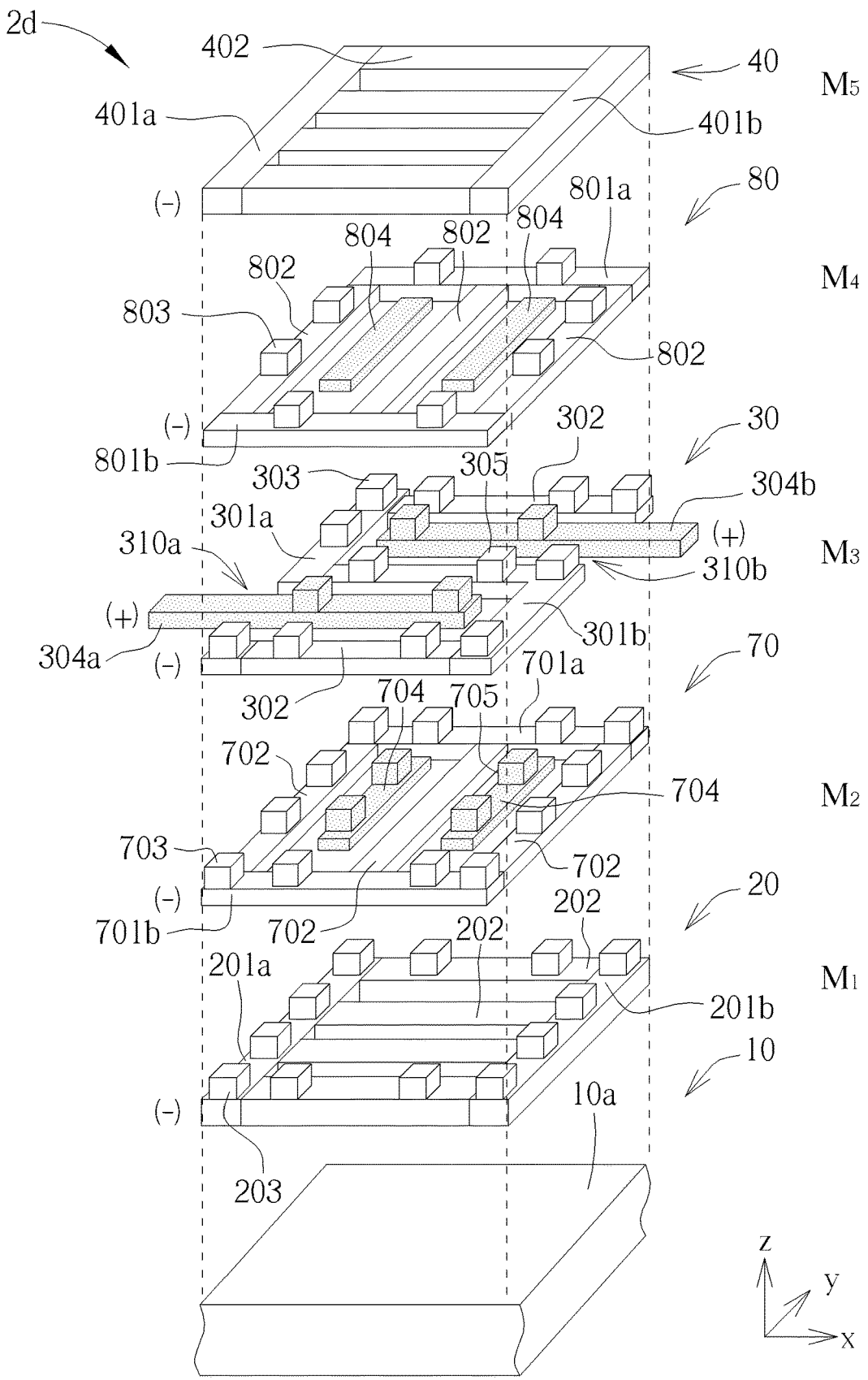
FIG. 10 is a perspective exploded diagram showing a shielded MOM capacitor according to yet another embodiment of the invention.

FIG. 10 is a perspective exploded diagram showing a shielded MOM capacitor according to yet another embodiment of the invention, wherein like numeral numbers designate like elements, regions, or layers. As shown in FIG. 10, the shielded MOM capacitor 2d is a five-layer (i.e. five metal layer) stack structure, which comprises a lower shielding plate 20, for example, in the M1 layer, an intermediate shielding plate 70, in the M2 layer, on the lower shielding plate 20, a middle plate 30, in the M3 layer, on the intermediate shielding plate 70, an intermediate shielding plate 80, in the M4 layer, on middle plate 30, and an upper shielding plate 40, in the M5 layer, on the intermediate shielding plate 80.

According to the embodiment, the middle plate 30 comprises one connecting bar 301a extending along the reference y-axis and a plurality of fingers 302 extending from one side of the connecting bar 301a along the reference x-axis. The connecting bars 301a and 301b are both discontinuous and have gaps 310a and 310b, respectively. In FIG. 10, the connecting bars 301a, 301b and the fingers 302 are arranged as a S-shaped or serpentine layout. The middle plate 30 further comprises electrode strips 304a and 304b, which are coplanar with the connecting bars 301a, 301b and the fingers 302. The electrode strips 304a and 304b are disposed between the fingers 302. The electrode strips 304a and 304b extend along the reference x-axis and pass through the gaps 310a and 310b, respectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A shielded metal-oxide-metal (MOM) capacitor, comprising:
   a substrate;
   a lower shielding plate disposed on the substrate and in parallel with a major surface of the substrate;
   an upper shielding plate situated above the lower shielding plate and in parallel with the lower shielding plate; and
   a middle plate sandwiched between the lower shielding plate and the upper shielding plate, wherein the middle plate comprises two parallel first connecting bars extending along a second direction, a plurality of first fingers extending between the two parallel first connecting bars along a first direction, and an electrode spaced apart from and surrounded by the two parallel first connecting bars and the first fingers, wherein the electrode does not extend into the upper shielding plate or the lower shielding plate, wherein one of the two parallel first connecting bars is discontinuous and has a gap, wherein the electrode extends along the second direction and passes through the gap, and wherein the electrode is a single and straight strip.

2. The shielded MOM capacitor according to claim 1, wherein the lower shielding plate comprise two parallel second connecting bars extending along the first direction and a plurality of second fingers extending between the two parallel second connecting bars along the second direction.

3. The shielded MOM capacitor according to claim 2, wherein the upper shielding plate comprise two parallel third connecting bars extending along the first direction and a plurality of third fingers extending between the two parallel third connecting bars along the second direction.

4. The shielded MOM capacitor according to claim 3, wherein each of the second fingers has two distal ends that are in direct contact with the two parallel second connecting bars, respectively, wherein each of the third fingers has two distal ends that are in direct contact with the two parallel third connecting bars, respectively.

5. The shielded MOM capacitor according to claim 4, wherein the electrode strip is coplanar with the first connecting bars and the first fingers.

6. The shielded MOM capacitor according to claim 3, wherein the first, second, and third connecting bars and the first, second, third fingers are electrically coupled to a first polarity, and the electrode strip is electrically coupled to second polarity.

7. The shielded MOM capacitor according to claim 6, wherein the first polarity is ground.

8. The shielded MOM capacitor according to claim 3 further comprising:
a first intermediate shielding plate between the middle plate and the lower shielding plate; and
a second intermediate shielding plate between the middle plate and the upper shielding plate.

9. The shielded MOM capacitor according to claim 8, wherein the first intermediate shielding plate comprises:
two parallel fourth connecting bars extending along the first direction and a plurality of fourth fingers extending between the two parallel fourth connecting bars along the second direction; and
lower electrode strips disposed between the fourth fingers, wherein each of the lower electrode strips is spaced apart from the adjacent fourth fingers and the fourth connecting bars and is enclosed by the fourth fingers and the fourth connecting bars.

10. The shielded MOM capacitor according to claim 9, wherein the lower electrode strips are electrically connected to the electrode strip of the middle plate, and wherein the lower electrode strips and the electrode strip have the same polarity.

11. The shielded MOM capacitor according to claim 10, wherein the second intermediate shielding plate comprises:
two parallel sixth connecting bars extending along the first direction and a plurality of sixth fingers extending between the two parallel sixth connecting bars along the second direction; and
upper electrode strips disposed between the sixth fingers, wherein each of the upper electrode strips is spaced apart from the adjacent sixth fingers and the sixth connecting bars and is enclosed by the sixth fingers and the sixth connecting bars.

12. The shielded MOM capacitor according to claim 11, wherein the upper electrode strips are electrically connected to the electrode strip of the middle plate, and wherein the upper electrode strips and the electrode strip have the same polarity.

13. The shielded MOM capacitor according to claim 1, wherein the first direction is perpendicular to the second direction.

14. The shielded MOM capacitor according to claim 1, wherein the lower shielding plate and the upper shielding plate are both a continuous, horizontal metal plate that does not have any slit or opening in it.

15. The shielded MOM capacitor according to claim 1, wherein the lower shielding plate is electrically connected to the two parallel first connecting bars and the plurality of first fingers through a first slot via, and wherein the upper shielding plate is electrically connected to the two parallel first connecting bars and the plurality of first fingers through a second slot via.

16. The shielded MOM capacitor according to claim 1, wherein one of the first connecting bars and the first fingers are arranged as an E-shaped layout.

17. The shielded MOM capacitor according to claim 1, wherein the first connecting bars and the first fingers are arranged as a S-shaped or serpentine layout.

18. A shielded metal-oxide-metal (MOM) capacitor, comprising:
a substrate;
a lower shielding plate disposed on the substrate and in parallel with a major surface of the substrate;
an upper shielding plate situated above the lower shielding plate and in parallel with the lower shielding plate; and
a middle plate disposed between the lower shielding plate and the upper shielding plate, wherein the middle plate comprises two parallel first connecting bars extending along a first direction, a plurality of first fingers extending between the two parallel first connecting bars along a second direction, and an electrode spaced apart from the two parallel first connecting bars and the first fingers, wherein the first connecting bars and the first fingers are electrically coupled to a first polarity, and the electrode strip is electrically coupled to second polarity, wherein the electrode does not extend into the upper shielding plate or the lower shielding plate, wherein one of the two parallel first connecting bars is discontinuous and has a gap, wherein the electrode extends along the second direction and passes through the gap, and wherein the electrode is a single and straight strip.

* * * * *